United States Patent
Lin et al.

(10) Patent No.: US 11,133,416 B2
(45) Date of Patent: Sep. 28, 2021

(54) METHODS OF FORMING SEMICONDUCTOR DEVICES HAVING PLURAL EPITAXIAL LAYERS

(71) Applicant: Taiwan Semiconductor Manufacturing Company, Ltd., Hsinchu (TW)

(72) Inventors: Yan-Ting Lin, Baoshan Township (TW); Hsueh-Chang Sung, Zhubei (TW); Yen-Ru Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 66 days.

(21) Appl. No.: 16/549,050

(22) Filed: Aug. 23, 2019

(65) Prior Publication Data

US 2021/0057570 A1 Feb. 25, 2021

(51) Int. Cl.
*H01L 21/8234* (2006.01)
*H01L 29/78* (2006.01)
*H01L 27/088* (2006.01)
*H01L 29/66* (2006.01)
*H01L 29/417* (2006.01)
(Continued)

(52) U.S. Cl.
CPC ...... *H01L 29/785* (2013.01); *H01L 21/02532* (2013.01); *H01L 21/02579* (2013.01); *H01L 21/823418* (2013.01); *H01L 21/823431* (2013.01); *H01L 27/0886* (2013.01); *H01L 29/0653* (2013.01); *H01L 29/41775* (2013.01); *H01L 29/41791* (2013.01); *H01L 29/66636* (2013.01); *H01L 29/66795* (2013.01)

(58) Field of Classification Search
CPC ........... H01L 21/02532; H01L 21/0257; H01L 21/02579; H01L 21/0262; H01L 21/823418; H01L 21/823431; H01L 27/0886; H01L 29/161; H01L 29/167; H01L 29/41775; H01L 29/41783; H01L 29/41791; H01L 29/66477; H01L 29/66795; H01L 29/78; H01L 29/785; H01L 29/7851

See application file for complete search history.

(56) References Cited

U.S. PATENT DOCUMENTS

| | | | |
|---|---|---|---|
| 8,900,978 B1 * | 12/2014 | Loubet | H01L 27/092 438/494 |
| 8,962,400 B2 | 2/2015 | Tsai et al. | |
| 9,093,514 B2 | 7/2015 | Tsai et al. | |

(Continued)

*Primary Examiner* — Stephen W Smoot
(74) *Attorney, Agent, or Firm* — Slater Matsil, LLP

(57) ABSTRACT

In an embodiment, a device includes: a fin extending from a substrate; a gate stack over a channel region of the fin; and a source/drain region in the fin adjacent the channel region, the source/drain region including: a first epitaxial layer contacting sidewalls of the fin, the first epitaxial layer including silicon and germanium doped with a dopant, the first epitaxial layer having a first concentration of the dopant; and a second epitaxial layer on the first epitaxial layer, the second epitaxial layer including silicon and germanium doped with the dopant, the second epitaxial layer having a second concentration of the dopant, the second concentration being greater than the first concentration, the first epitaxial layer and the second epitaxial layer having a same germanium concentration.

20 Claims, 16 Drawing Sheets

(51) Int. Cl.
  *H01L 29/06*  (2006.01)
  *H01L 21/02*  (2006.01)

(56)  References Cited

U.S. PATENT DOCUMENTS

| | | | |
|---|---|---|---|
| 9,236,267 B2 | 1/2016 | De et al. | |
| 9,245,805 B2 | 1/2016 | Yeh et al. | |
| 9,418,897 B1 | 8/2016 | Ching et al. | |
| 9,520,482 B1 | 12/2016 | Chang et al. | |
| 9,576,814 B2 | 2/2017 | Wu et al. | |
| 9,608,116 B2 | 3/2017 | Ching et al. | |
| 9,634,119 B2 * | 4/2017 | Hsiao | H01L 21/0262 |
| 9,812,363 B1 | 11/2017 | Liao et al. | |
| 9,859,380 B2 | 1/2018 | Lee et al. | |
| 2014/0087537 A1 * | 3/2014 | Kim | H01L 29/66636 |
| | | | 438/301 |
| 2014/0264348 A1 * | 9/2014 | Tsai | C30B 25/165 |
| | | | 257/57 |
| 2015/0303118 A1 * | 10/2015 | Wang | H01L 21/823431 |
| | | | 257/401 |
| 2019/0097006 A1 * | 3/2019 | Li | H01L 21/823475 |
| 2020/0105876 A1 * | 4/2020 | Ting | H01L 21/02532 |
| 2020/0176565 A1 * | 6/2020 | Ting | H01L 21/02532 |

* cited by examiner

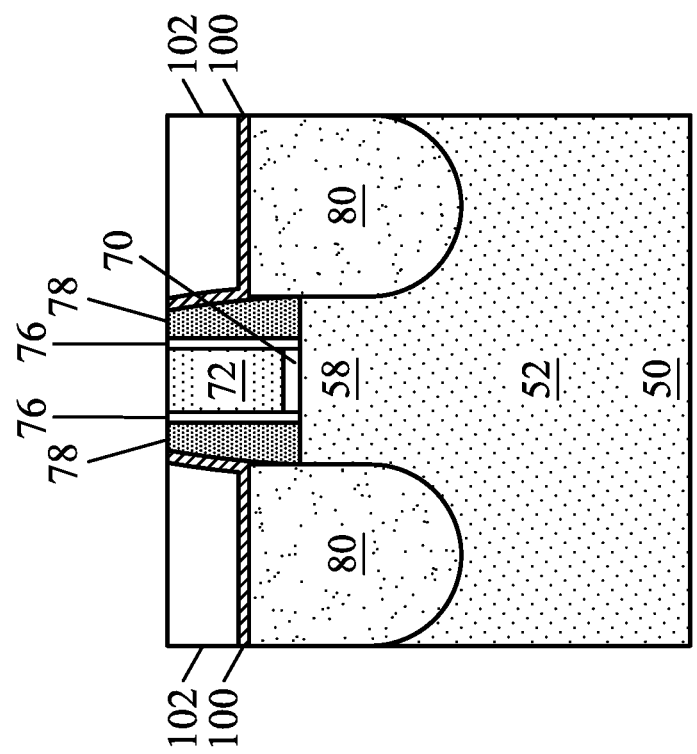
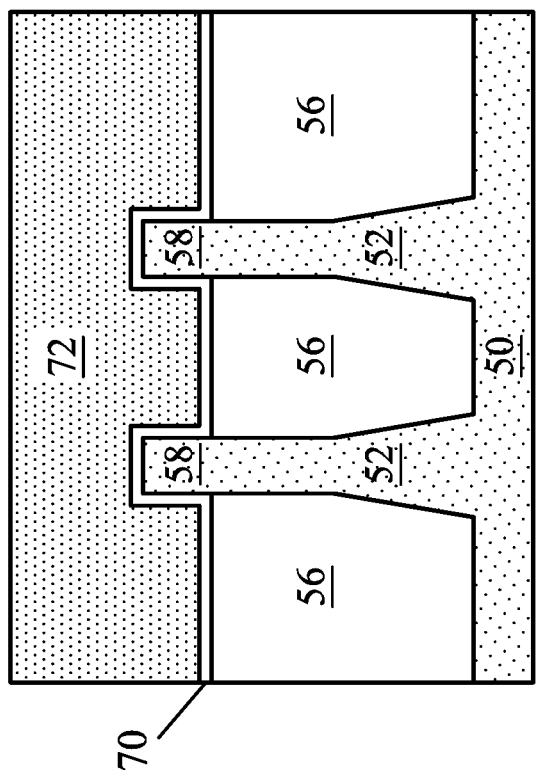
Figure 12A
Figure 12B

METHODS OF FORMING SEMICONDUCTOR DEVICES HAVING PLURAL EPITAXIAL LAYERS

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4A, 4B, 5A, 5B, 6, 7, 8, 9, 10, 11A, 11B, 12A, 12B, 13A, 13B, 14A, 14B, 14C, 15A, and 15B are cross-sectional views of intermediate stages in the manufacturing of FinFETs, in accordance with some embodiments.

DETAILED DESCRIPTION

Figure 1:
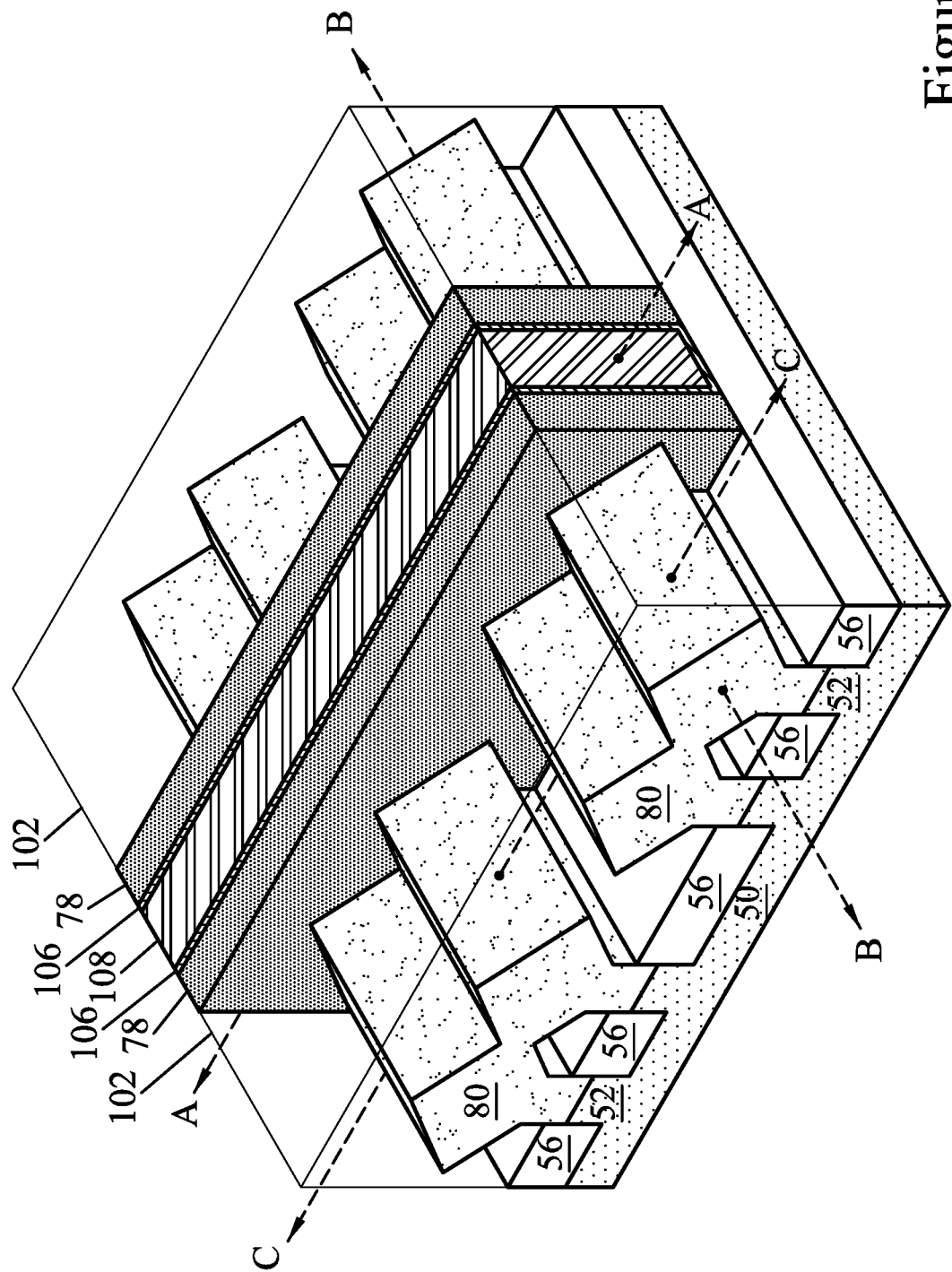
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, epitaxial source/drain regions having multiple epitaxial layers are grown in semiconductor fins. The bottommost epitaxial layers are grown on sidewalls of the semiconductor fins, and are grown at a lower temperature and a higher pressure than the remaining layers. The bottommost epitaxial layers may thus be grown with a more conformal profile, allowing the germanium concentration of the bottommost epitaxial layers to be increased without risking damage to the epitaxial source/drain regions. Forming the epitaxial source/drain regions with a higher germanium concentration at the sidewalls of the semiconductor fins allows the performance of the resulting devices (e.g., transistors) to be increased.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refers to the portions extending between the neighboring STI regions 56.

Gate dielectrics 106 are along sidewalls and over top surfaces of the fins 52, and gate electrodes 108 are over the gate dielectrics 106. Source/drain regions 80 are disposed in opposite sides of the fin 52 with respect to the gate dielectrics 106 and gate electrodes 108. Gate spacers 78 separate the source/drain regions 80 from the gate dielectrics 106 and gate electrodes 108. An inter-layer dielectric (ILD) 102 is disposed over the source/drain regions 80 and STI regions 56. In embodiments where multiple transistors are formed, the source/drain regions 80 may be shared between various transistors. In embodiments where one transistor is formed from multiple fins 52, neighboring source/drain regions 80 may be electrically connected, such as through coalescing the source/drain regions 80 by epitaxial growth, or through coupling the source/drain regions 80 with a same source/drain contact.

FIG. 1 further illustrates several reference cross-sections. Cross-section A-A is along a longitudinal axis of the gate electrode 108 and in a direction, for example, perpendicular to the direction of current flow between the source/drain regions 80 of a FinFET. Cross-section B-B is perpendicular to cross-section A-A and is along a longitudinal axis of the fin 52 and in a direction of, for example, a current flow between the source/drain regions 80 of a FinFET. Cross-section C-C is parallel to cross-section A-A and extends through a source/drain region 80 of the FinFET. Subsequent figures refer to these reference cross-sections for clarity.

Some embodiments discussed herein are discussed in the context of FinFETs formed using a gate-last process. In other embodiments, a gate-first process may be used. Also, some embodiments contemplate aspects used in planar devices, such as planar FETs.

Figure 2:
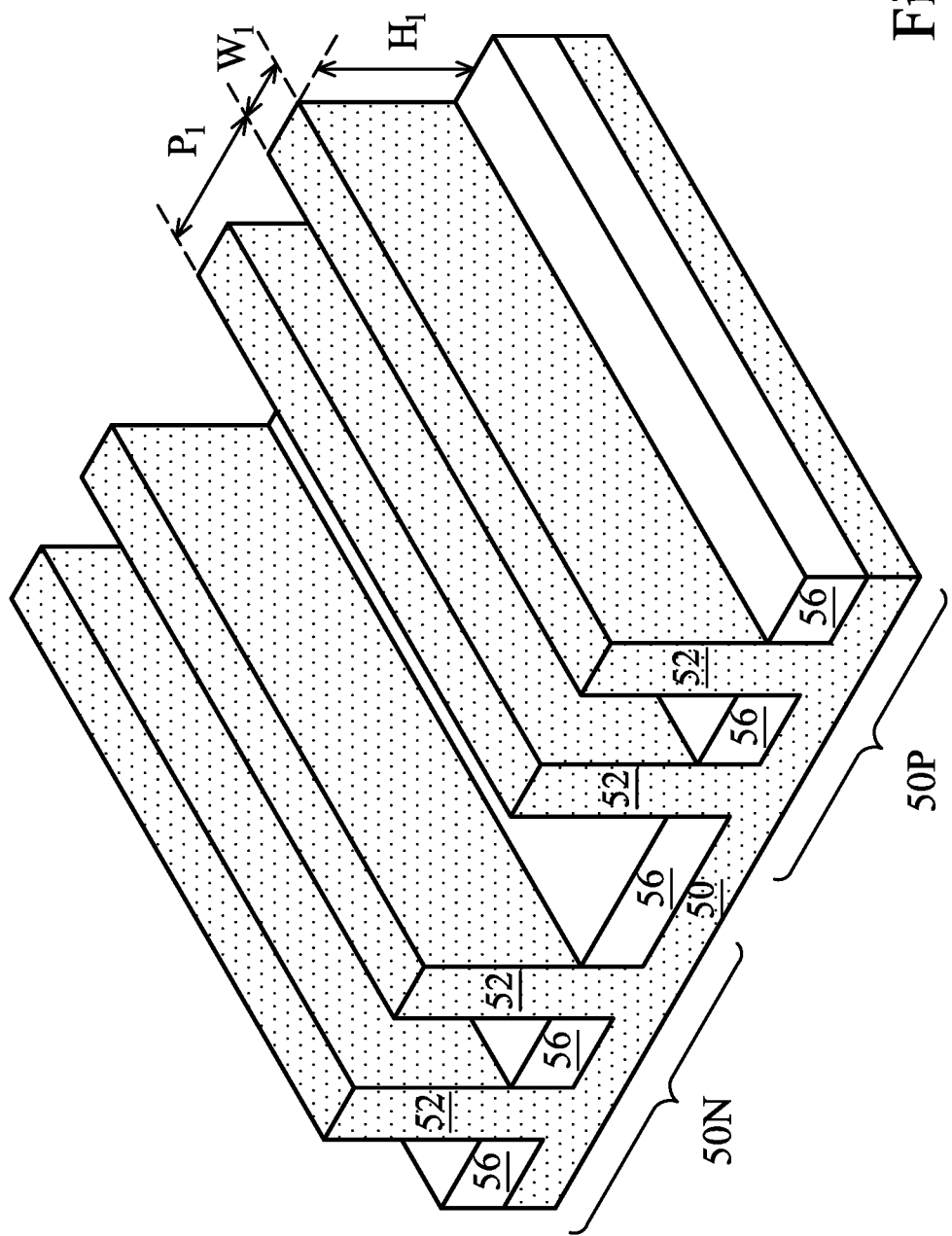
Figure 3:
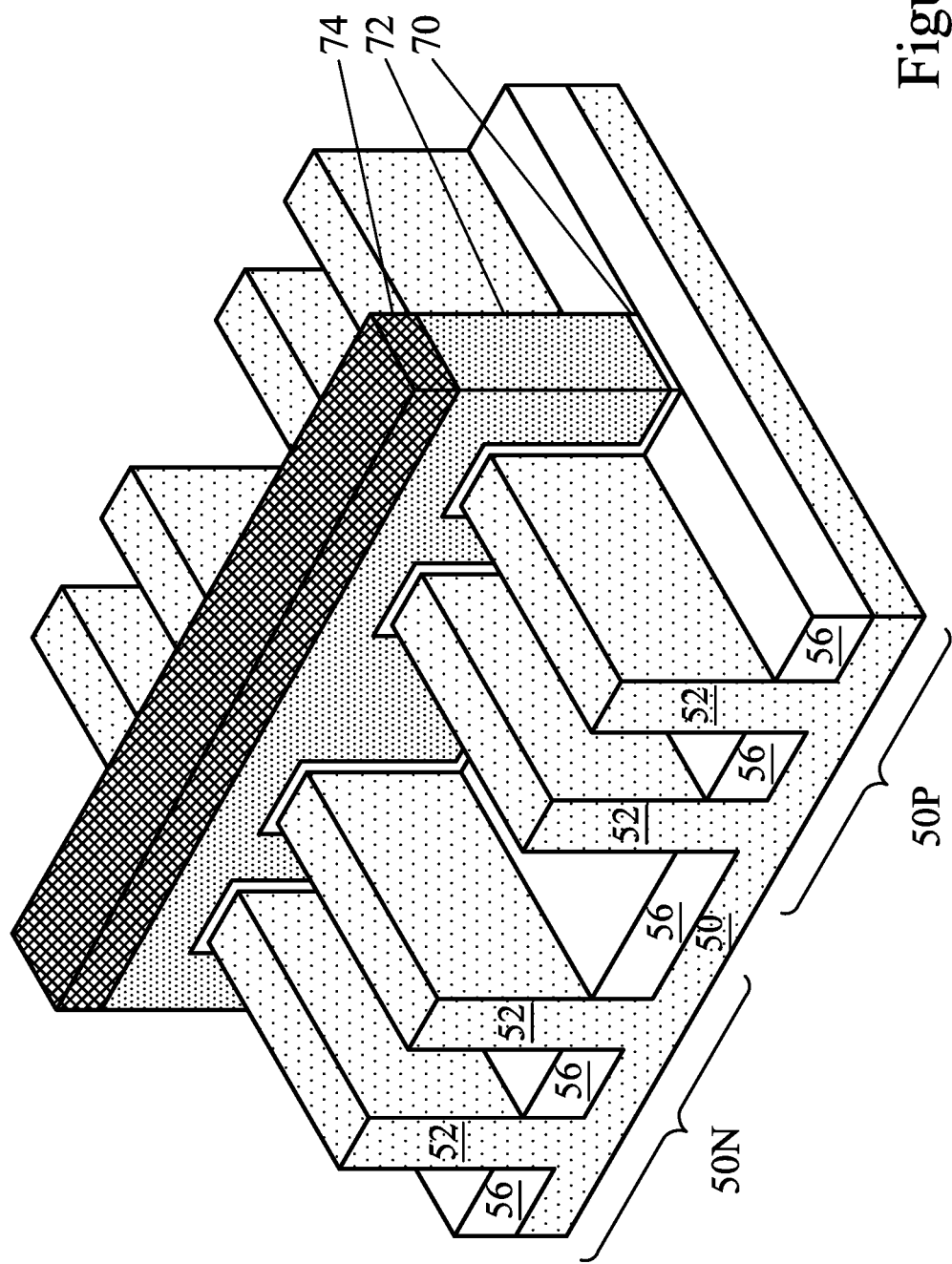

FIGS. 2 through 15B are various views of intermediate stages in the manufacturing of FinFETs, in accordance with some embodiments. FIGS. 2 and 3 are three-dimensional views. FIGS. 4A, 5A, 11A, 12A, 13A, 14A, and 15A are cross-sectional views illustrated along reference cross-section A-A in FIG. 1, except for multiple fins/FinFETs. FIGS. 4B, 5B, 6, 7, 8, 9, 11B, 12B, 13B, 14B, 14C, and 15B are cross-sectional views illustrated along reference cross-section B-B in FIG. 1, except for multiple fins/FinFETs.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. For example, when p-type devices are formed, the substrate 50 may be a strained material such as silicon germanium ($Si_xGe_{1-x}$, where x can be in the range of 0 to 1) having a germanium concentration in the range of about 0% to about 40%, such that FinFETs with p-type fully strained channel (PFSC) regions are formed.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 have a width $W_1$, and fins 52 in a same region 50N/50P are spaced apart by a pitch $P_1$. The width $W_1$ can be in the range of about 3 nm to about 30 nm. The pitch $P_1$ can be in the range of about 20 nm to about 100 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend a height $H_1$ above top surfaces of the STI regions 56. The height $H_1$ can be greater than about 40 nm, such as in the range of about 50 nm to about 80 nm. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer an be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $CM^{-3}$ and about $10^{18}$ $CM^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 70 are formed over the fins 52 and dummy gates 72 are formed over the dummy gate dielectrics 70. The dummy gate dielectrics 70 and dummy gates 72 may be collectively referred to as "dummy gate stacks," with each dummy gate stack including a dummy gate dielectric 70 and a dummy gate 72. The dummy gate stacks extend along sidewalls of the fins 52. Although only one dummy gate stack is illustrated, it should be appreciated that multiple dummy gate stack are simultaneously formed, and each fin 52 may have multiple dummy gate stacks formed thereon.

As an example of forming the dummy gate dielectrics 70 and dummy gates 72, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of isolation regions. The mask layer may include, for example, silicon nitride, silicon oxynitride, or the like. In this example, a single dummy gate layer and a single mask layer are formed across the region 50N and the region 50P. It is noted that the dummy dielectric layer is shown covering only the fins 52 for illustrative purposes only. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 74. The pattern of the masks 74 is then transferred to the dummy gate layer by an acceptable etching technique to form dummy gates 72. The pattern of the masks 74 is further transferred to the dummy dielectric layer to form dummy gate dielectrics 70. The dummy gates 72 cover respective channel regions of the fins 52. The pattern of the masks 74 may be used to physically separate each of the dummy gates 72 from adjacent dummy gates. The dummy gates 72 may also have a lengthwise direction substantially perpendicular to the lengthwise direction of respective epitaxial fins 52.

Figure 4B:
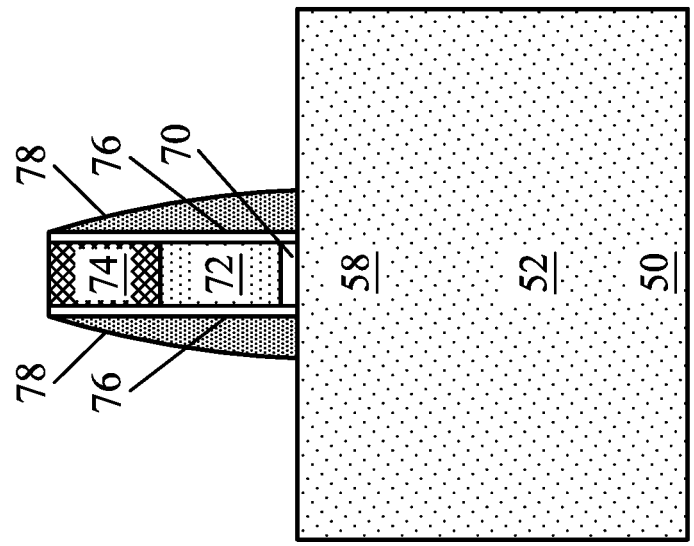
Figure 4A:
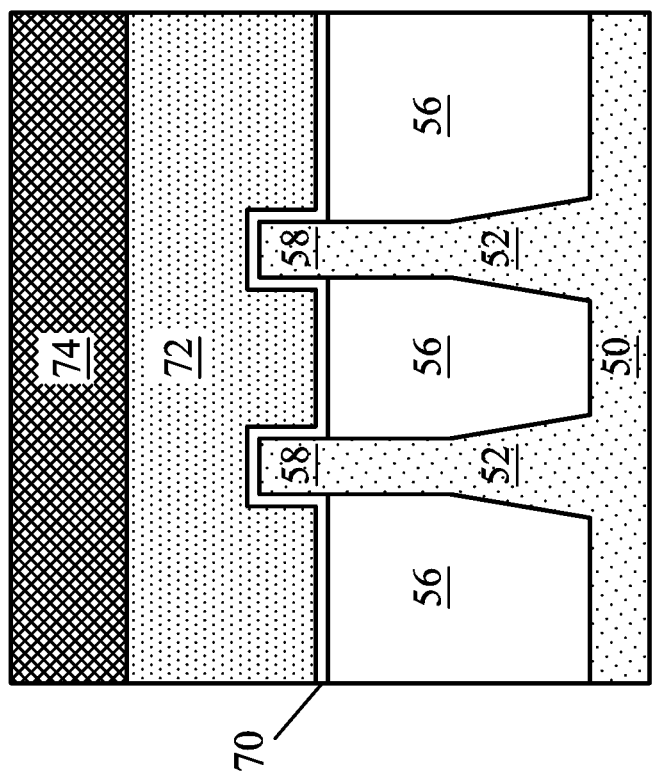

In FIGS. 4A and 4B, gate seal spacers 76 are formed on exposed surfaces of the dummy gates 72, the masks 74, and/or the fins 52. A thermal oxidation or a deposition followed by an anisotropic etch may form the gate seal spacers 76.

After the formation of the gate seal spacers 76, implants for lightly doped source/drain (LDD) regions (not explicitly illustrated) may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities of from about $10^{15}$ cm$^{-3}$ to about $10^{16}$ cm$^{-3}$. An anneal may be used to activate the implanted impurities.

Further, gate spacers 78 may be formed on the gate seal spacers 76 along sidewalls of the dummy gates 72 and the masks 74. The gate spacers 78 may be formed by conformally depositing an insulating material and subsequently anisotropically etching the insulating material. The insulating material of the gate spacers 78 may be silicon nitride, silicon carbon nitride, a combination thereof, or the like. In some embodiments (not shown), the gate spacers 78 are formed from a multi-layered insulating material, and include multiple layers. For example, the gate spacers 78 may include multiple layers of silicon nitride, or may include a layer of silicon oxide disposed between two layers of silicon nitride. The gate spacers 78 may be formed concurrently with or after the gate seal spacers 76. In some embodiments, a first spacer layer for the gate seal spacers 76 is conformally formed, a second spacer layer for the gate spacers 78 is conformally formed on the first spacer layer, and both spacers layers are patterned together to simultaneously pattern the gate seal spacers 76 and gate spacers 78. Formation of both the gate seal spacers 76 and gate spacers 78 is optional. In some embodiments, a single spacer layer is formed and patterned to form single-layered spacers.

Figure 5A:
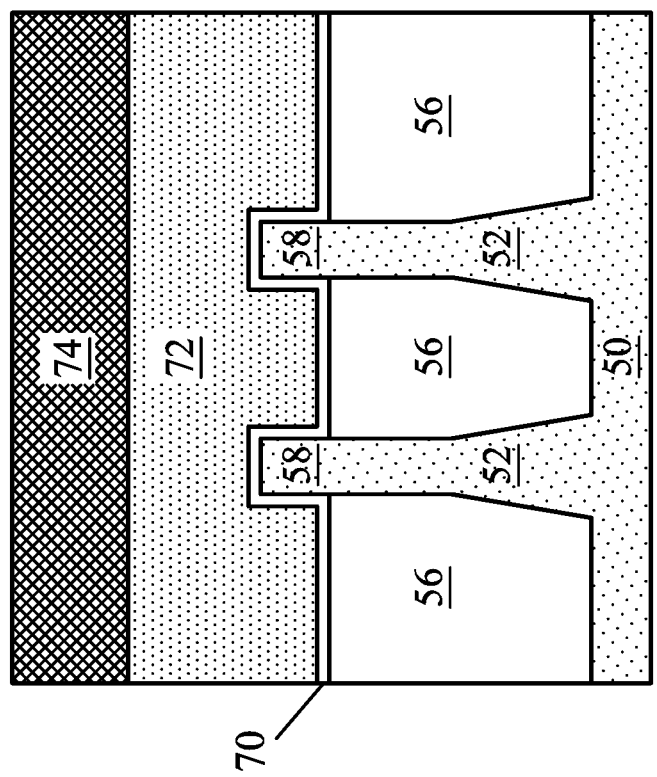
Figure 5B:
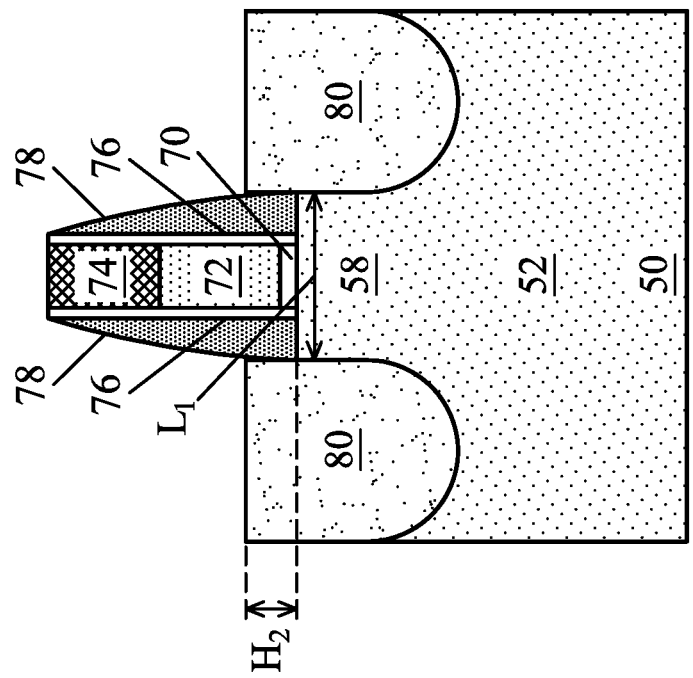

In FIGS. 5A and 5B, epitaxial source/drain regions 80 are formed in the fins 52 to exert stress in respective channel regions 58 of the fins 52, thereby improving performance. The epitaxial source/drain regions 80 are formed in the fins 52 such that each dummy gate 72 is disposed between respective neighboring pairs of the epitaxial source/drain regions 80. In some embodiments the epitaxial source/drain regions 80 may extend into portions of the fins 52 beneath the top surfaces of the STI regions 56. In some embodiments, the gate spacers 78 are used to separate the epitaxial source/drain regions 80 from the dummy gates 72 by an appropriate lateral distance so that the epitaxial source/drain regions 80 do not short out subsequently formed gates of the resulting FinFETs. As discussed further below, the epitaxial source/drain regions 80 are multilayered epitaxial regions that include a plurality of doped semiconductor layers. The epitaxial source/drain regions 80 are formed spaced apart, such that the channel regions 58 of the fins 52 have a length $L_1$. In some embodiments, the length $L_1$ of the channel regions 58 can in be in the range of about 10 nm to about 100 nm. Further, as discussed below, the epitaxial source/drain regions 80 are raised from surfaces of the fins 52, such that topmost surfaces of the epitaxial source/drain regions 80 extend a height $H_2$ above topmost surfaces of the fins 52. The height $H_2$ can be greater than about 3 nm, such as in the range of about 3 nm to about 8 nm.

FIGS. 6 through 9 are cross-sectional views of intermediate stages in the formation of the epitaxial source/drain regions 80. As noted above, each fin 52 may have multiple dummy gates 72 formed thereon. The formation of one epitaxial source/drain region 80 between two dummy gates 72 is illustrated, but it should be appreciated that multiple epitaxial source/drain regions 80 are formed simultaneously.

The illustrated process may be used to form the epitaxial source/drain regions 80 in the region 50N or the region 50P. The epitaxial source/drain regions 80 in the region 50N, e.g., the NMOS region, may be formed by masking the region 50P, e.g., the PMOS region, and performing the illustrated steps. The epitaxial source/drain regions 80 in the region 50N may include any acceptable material, such as appropriate for n-type FinFETs. For example, if the fins 52 are silicon, the epitaxial source/drain regions 80 in the region 50N may include materials exerting a tensile strain in the channel region 58, such as silicon, SiC, SiCP, SiP, or the like. The mask may then be removed. The epitaxial source/drain regions 80 in the region 50P, e.g., the PMOS region, may then be formed by masking the region 50N, e.g., the NMOS region, and repeating the illustrated steps. The epitaxial source/drain regions 80 may include any acceptable material, such as appropriate for p-type FinFETs. For example, if the fin 52 is silicon, the epitaxial source/drain regions 80 in the region 50P may comprise materials exerting a compressive strain in the channel region 58, such as SiGe, SiGeB, Ge, GeSn, or the like. As discussed further below, the epitaxial source/drain regions 80 are in situ doped with n-type and/or p-type impurities during growth, thus forming source/drain regions. The n-type and/or p-type impurities for source/drain regions may be any of the impurities previously discussed.

Figure 6:
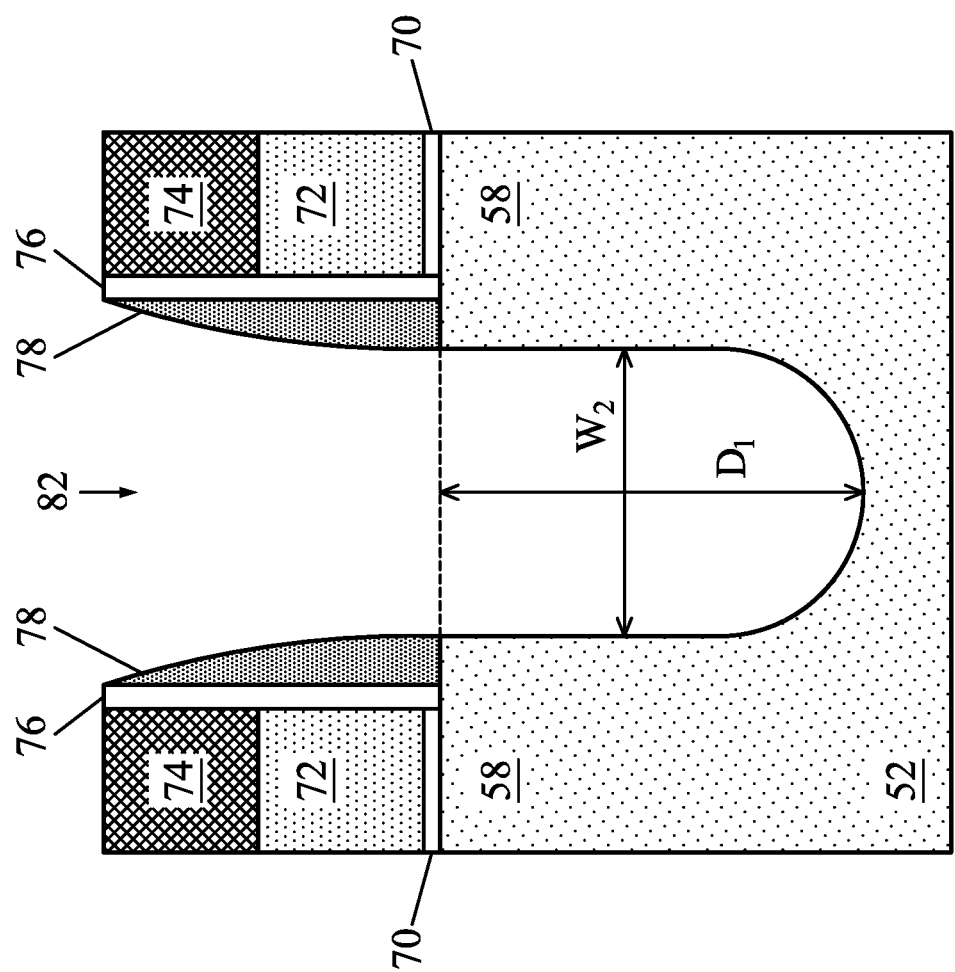

In FIG. 6, recesses 82 are formed in source/drain regions of the fins 52, between neighboring ones of the gate spacers 78, and are formed on the ends of the fins 52. The recesses 82 may be formed using acceptable photolithography and etching techniques. The recesses 82 are formed to a width $W_2$, which is equal to the distance between the neighboring ones of the gate spacers 78. In some embodiments, the width $W_2$ is in the range of about 10 nm to about 100 nm. The recesses 82 are formed to a depth $D_1$. In some embodiments, the depth $D_1$ is greater than about 40 nm. The recesses 82 may extend partially into or completely through the fins 52.

Figure 7:
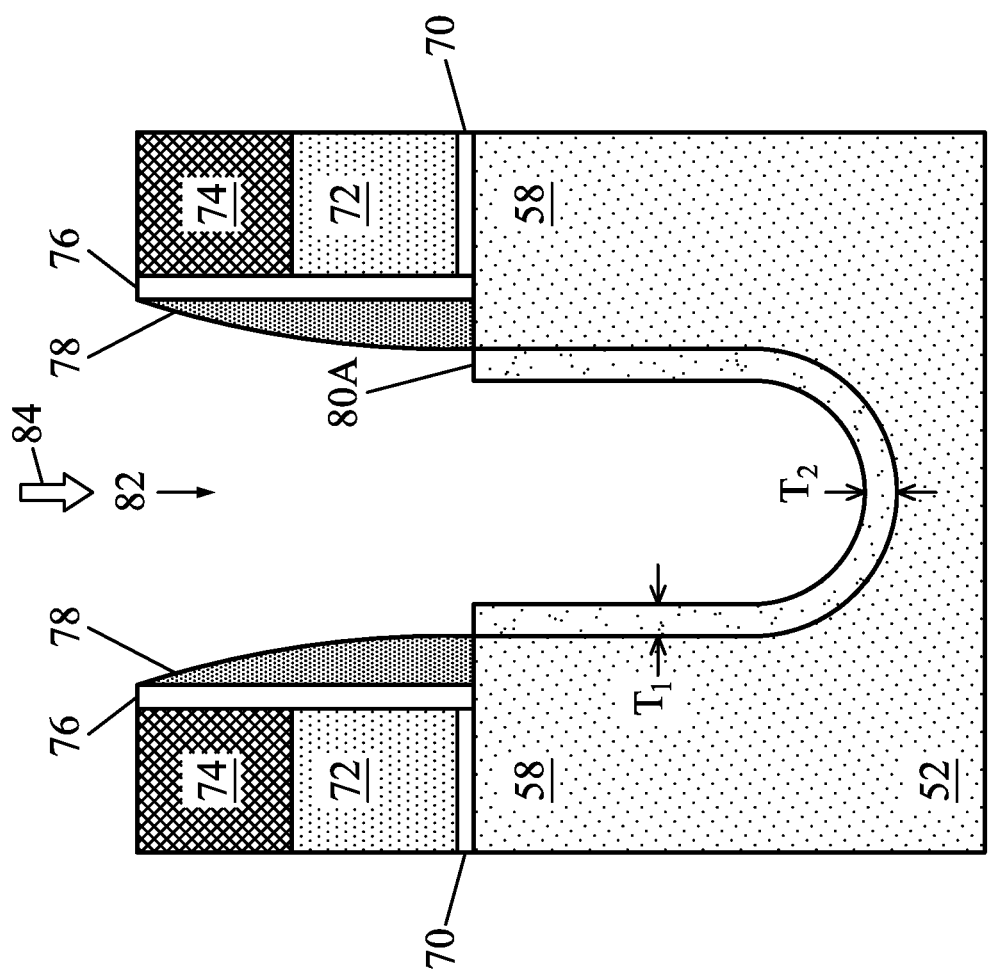

In FIG. 7, a first epitaxial growth process 84 is performed to form first epitaxial layers 80A of the epitaxial source/drain regions 80 in the recesses 82. As discussed below, the growth profile of the first epitaxial growth process 84 is such that the growth rate on the sidewalls of the recesses 82 and the growth rate on the bottoms of the recesses 82 differ by a small amount, such as by less than 50%.

During the first epitaxial growth process 84, the recesses 82 are exposed to several precursors, including semiconductor material precursor(s), dopant precursor(s), and etching precursor(s). The recesses 82 may be simultaneously exposed to all of the precursors, or may be exposed to the precursors in repeating cycles. For example, the recesses 82 may be exposed to the semiconductor material precursor(s) and dopant precursor(s) in first portions of the cycles, and the etching precursor(s) in second portions of the cycles. The first epitaxial layers 80A may have a low dopant concentration, which may increase adhesion to the material of the fins 52. In embodiments where the epitaxial source/drain regions 80 include silicon germanium, such as when p-type source/drain regions are formed, the first epitaxial layers 80A are formed with a low p-type dopant (e.g., boron) concentration and a high germanium concentration. For example, the p-type dopant (e.g., boron) concentration of the first epitaxial layers 80A may be greater than $2 \times 10^{20}$ cm$^{-3}$, such as in the range of about $2 \times 10^{20}$ cm$^{-3}$ to about $3 \times 10^{20}$ cm$^{-3}$, and the germanium concentration of the first epitaxial layers 80A may be in the range of about 45 atomic percent (at. %) to about 55 at. %. The dopant and germanium concentrations of the first epitaxial layers 80A may be controlled by selection of the growth precursors and their flow rates.

The semiconductor material precursor(s) for the first epitaxial growth process 84 include precursors for depositing a desired semiconductor material. Example semiconductor material precursors include silane (SiH$_4$), germane (GeH$_4$), dichlorosilane (DCS) (H$_2$SiCl$_2$), disilane (DS) (Si$_2$H$_6$), trichlorosilane (TCS) (HSiCl$_3$), and the like. For example, in an embodiment where the epitaxial source/drain regions 80 are formed from silicon, such as when n-type source/drain regions are formed, the semiconductor material precursors include silane. Likewise, in an embodiment where the epitaxial source/drain regions 80 are formed from silicon germanium, such as when p-type source/drain regions are formed, the semiconductor material precursors include silane and germane. As discussed further below, the first epitaxial growth process 84 is performed with a low temperature. The first epitaxial growth process 84 uses silane as one of the semiconductor material precursors, as silane can used for deposition at low temperatures.

The dopant precursor(s) include any precursors of a desired conductivity type that complements the semiconductor material precursors. For example, in an embodiment where the epitaxial source/drain regions 80 are SiCP, such as when n-type source/drain regions are formed, the dopant precursors may include a phosphorous precursor such as phosphine (PH$_3$) and a carbon precursor such as a hydrocarbon (C$_x$H$_y$). Likewise, in an embodiment where the epitaxial source/drain regions 80 are SiGeB, such as when p-type source/drain regions are formed, the dopant precursors may include a boron precursor such as diborane (B$_2$H$_6$).

The etching precursor(s) control growth during the first epitaxial growth process 84. In particular, the etching precursors controls growth selectivity such that the first epitaxial layers 80A grow in desired locations (e.g., in the recesses 82 of the fins 52), and do not grow in undesired locations (e.g., on the STI regions 56). In some embodiments, the etching precursors include hydrochloric acid (HCl).

The first epitaxial growth process 84 is performed until the first epitaxial layers 80A are a desired thickness. The growth profile of the first epitaxial growth process 84 may be determined by controlling the temperature and pressure during the first epitaxial growth process 84. In particular, the first epitaxial growth process 84 is performed with a low temperature and a high pressure. For example, the temperature of the first epitaxial growth process 84 can be less than about 600° C., such as in the range of about 450° C. to about 600° C., and the pressure of the first epitaxial growth process 84 can be greater than about 50 Torr, such as in the range of about 50 Torr to about 100 Torr. At low growth temperatures, atoms have a lower migration capability, causing the atoms to have a lower selectivity between different crystalline orientations. Thus, at low temperatures, the difference in growth rates along the <100> direction and the <110> direction is reduced, causing the growth profile of the first epitaxial growth process 84 to be more conformal. Thus, although the growth rate of the first epitaxial growth process 84 along the sidewalls of the recesses 82 is less than the growth rate of the first epitaxial growth process 84 along the bottoms of the recesses 82, the growth rates differ by a small amount as a result of the low temperature and high pressure during the first epitaxial growth process 84. For example, the ratio of the growth rates along the sidewalls of the recesses 82 to the bottoms of the recesses 82 can be in the range of about 0.9 to about 1.0.

The first epitaxial layers 80A have a thickness $T_1$ along sides of the recesses 82, and have a thickness $T_2$ along bottoms of the recesses 82. Due to the growth rate differences of the first epitaxial growth process 84, the thicknesses $T_1$ and $T_2$ are different, with the sidewall thickness $T_1$ being greater than the bottom thickness $T_2$. For example, the sidewall thickness $T_1$ can be less than about 15 nm, such as in the range of about 5 nm to about 12 nm, and the bottom thickness $T_2$ can be in the range of from about 4.5 nm to about 11 nm, such as less than about 10 nm. Due to the growth profile of the first epitaxial growth process 84, the difference between the sidewall thickness $T_1$ and the bottom thickness $T_2$ is small. For example, the ratio of the sidewall thickness $T_1$ to the bottom thickness $T_2$ can be in the range of about 1 to about 1.1. As noted above, the germanium concentration of the first epitaxial layers 80A is high, such as in the range of about 45 at. % to about 55 at. %. Epitaxial growth processes for SiGeB with a high germanium concentration tend to have a bottom-up growth profile, but growing the first epitaxial layers 80A bottom-up will result in weak adhesion to the fins 52. The growth profile of the first epitaxial growth process 84 allows the first epitaxial layers 80A to be formed with a high germanium concentration, while still being sufficiently adhered to the fins 52. A high germanium concentration in the first epitaxial layers 80A increases stress exerted on the channel regions 58, thereby increasing the mobility of carriers and reducing the resistance in the channel regions 58 of the resulting FinFETs. A high germanium concentration in the first epitaxial layers 80A also decreases the resistance in the epitaxial source/drain regions 80, as the band gap of germanium is lower than the band gap of silicon. Reducing the resistance in the channel regions 58 and/or the epitaxial source/drain regions 80 may increase the performance of the resulting FinFETs.

Figure 8:
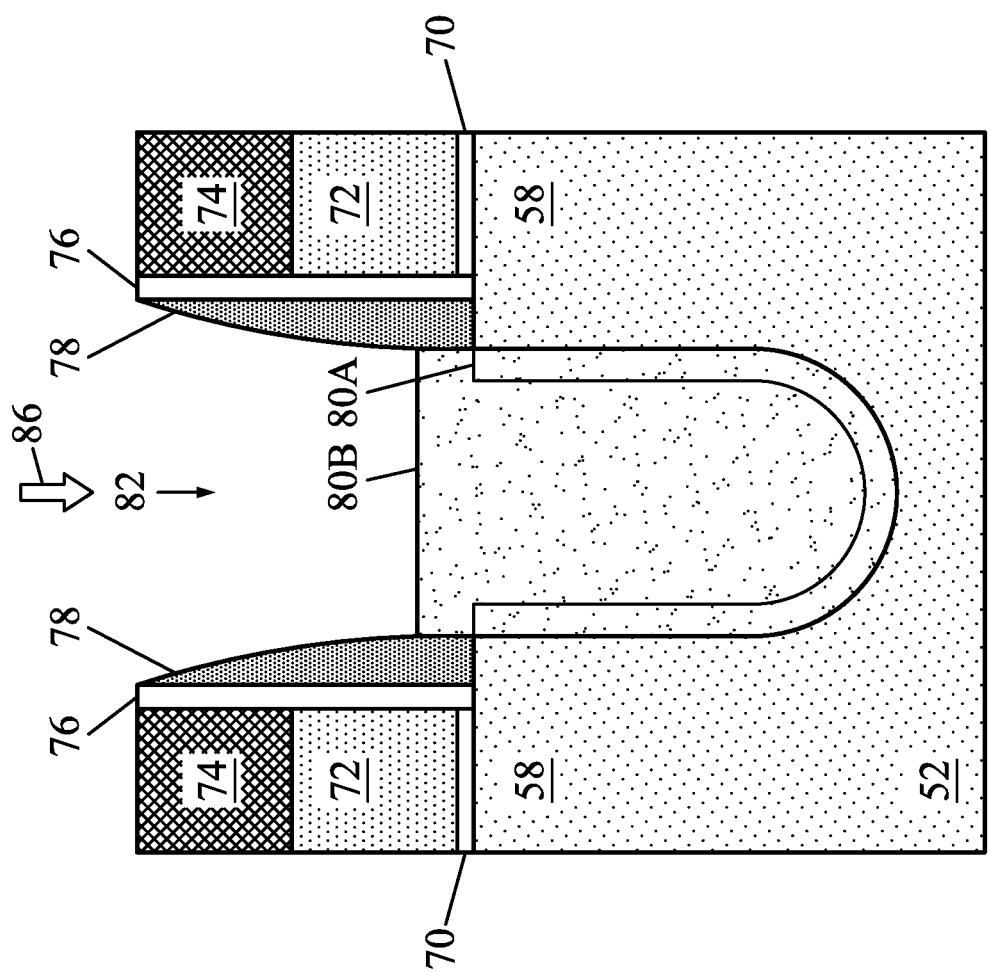

In FIG. 8, a second epitaxial growth process 86 is performed to form second epitaxial layers 80B of the epitaxial source/drain regions 80 in the recesses 82. The second epitaxial layers 80B fill the recesses 82, and may overfill the recesses 82. As discussed below, the second epitaxial growth process 86 has a bottom-up growth profile, such that the second epitaxial layers 80B grow from the bottoms of the recesses 82, and do not grow from the sidewalls of the recesses 82. In other words, the vertical growth rate (e.g., along the <100> direction) is greater during the second epitaxial growth process 86 than during the first epitaxial growth process 84. Likewise, the lateral growth rate (e.g., along the <110> direction) is lesser during the second epitaxial growth process 86 than during the first epitaxial growth process 84.

During the second epitaxial growth process 86, the recesses 82 are exposed to several precursors, including semiconductor material precursor(s), dopant precursor(s), and etching precursor(s). The recesses 82 may be simultaneously exposed to all of the precursors, or may be exposed to the precursors in repeating cycles. For example, the recesses 82 may be exposed to the semiconductor material precursor(s) and dopant precursor(s) in first portions of the cycles, and the etching precursor(s) in second portions of the cycles. The second epitaxial layers 80B have a greater dopant concentration than the first epitaxial layers 80A, which may provide sufficient majority carriers for the resulting FinFETs. In embodiments where the epitaxial source/ drain regions 80 include silicon germanium, such as when p-type source/drain regions are formed, the second epitaxial layers 80B are formed with a high p-type dopant (e.g., boron) concentration and a high germanium concentration. For example, the p-type dopant (e.g., boron) concentration of the second epitaxial layers 80B may be in the range of about $7 \times 10^{20}$ cm$^{-3}$ to about $1 \times 10^{21}$ cm$^{-3}$, and the germanium concentration of the second epitaxial layers 80B may be in the range of about 45 at. % to about 55 at. %. Notably, the germanium concentration of the second epitaxial layers 80B is about the same as the germanium concentration of the first epitaxial layers 80A. The germanium concentration of the second epitaxial layers 80B can be different from the germanium concentration of the first epitaxial layers 80A, but the germanium concentrations of the first epitaxial layers 80A and the second epitaxial layers 80B can be in the same range (e.g., about 45 at. % to about 55 at. %. The high germanium concentration allows the first epitaxial layers 80A to act as a barrier that helps reduce the migration of dopants (e.g., boron) from the second epitaxial layers 80B to the channel regions 58 during the second epitaxial growth process 86. Drain-induced barrier lowering (DIBL) may thus be reduced, increasing performance of the resulting FinFETs. Further, the dopant concentration of the second epitaxial layers 80B may be a gradient, decreasing in a direction extending from topmost surfaces of the second epitaxial layers 80B to bottommost surfaces of the second epitaxial layers 80B. The dopant and germanium concentrations of the second epitaxial layers 80B may be controlled by selection of the growth precursors and their flow rates.

The semiconductor material precursor(s) for the second epitaxial growth process 86 include precursors for depositing a desired semiconductor material. The semiconductor material precursors for the second epitaxial growth process 86 may (or may not) be the same semiconductor material precursors as the first epitaxial growth process 84. In some embodiments, at least one of the semiconductor material precursors for the second epitaxial growth process 86 is different from the semiconductor material precursors for the first epitaxial growth process 84. For example, in an embodiment where the epitaxial source/drain regions 80 are formed from silicon germanium, such as when p-type source/drain regions are formed, the semiconductor material precursors include DCS and germane. As discussed further below, the second epitaxial growth process 86 is performed with a high temperature. The second epitaxial growth process 86 uses DCS as one of the semiconductor material precursors, as DCS can used for deposition at high temperatures.

The dopant precursor(s) are the same dopant precursors as the first epitaxial growth process 84. As noted above, the dopant concentration of the second epitaxial layers 80B is greater than the dopant concentration of the first epitaxial layers 80A. As such, the flow rate of the dopant precursors during the second epitaxial growth process 86 may be greater than during the first epitaxial growth process 84. For example, the flow rate of the dopant precursors during the first epitaxial growth process 84 may be in a range of about 60 sccm to about 120 sccm, and the flow rate of the dopant precursors during the second epitaxial growth process 86 may be in a range of about 150 sccm to about 300 sccm.

The etching precursor(s) are the same etching precursors as the first epitaxial growth process 84. As noted above, the etching precursors control growth selectivity such that the first epitaxial layers 80A grow in desired locations (e.g., in the recesses 82 of the fins 52), and do not grow in undesired locations (e.g., on the STI regions 56). Because the vertical growth rate is greater during the second epitaxial growth process 86 than the first epitaxial growth process 84, additional etching may need to be performed to control growth selectivity. As such, the flow rate of the etching precursors during the second epitaxial growth process 86 may be greater than during the first epitaxial growth process 84.

The second epitaxial growth process 86 has a bottom-up growth profile, and is performed until the seconds epitaxial layers 80B are a desired thickness. The growth profile of the second epitaxial growth process 86 may be determined by controlling the temperature and pressure during the second epitaxial growth process 86. In particular, the second epitaxial growth process 86 is performed with a high temperature and a low pressure. For example, the temperature of the second epitaxial growth process 86 can be greater than about 600° C., such as in the range of about 600° C. to about 650° C., and the pressure of the second epitaxial growth process 86 can be less than about 50 Torr, such as in the range of about 10 Torr to about 20 Torr. At high growth temperatures, atoms have a higher migration capability, causing the atoms to have a higher selectivity between different crystalline orientations. Thus, at high temperatures, the difference in growth rates along the <100> direction and the <110> direction is increased, causing the growth profile of the second epitaxial growth process 86 to be more selective. As a result, the growth rate of the second epitaxial growth process 86 along the sidewalls of the recesses 82 is less than the growth rate of the second epitaxial growth process 86 along the bottoms of the recesses 82, and the growth rates differ by a large amount. For example, the ratio of the growth rates along the sidewalls of the recesses 82 to the growth rates along the bottoms of the recesses 82 can be in the range of about 0.1 to about 0.3.

Figure 9:
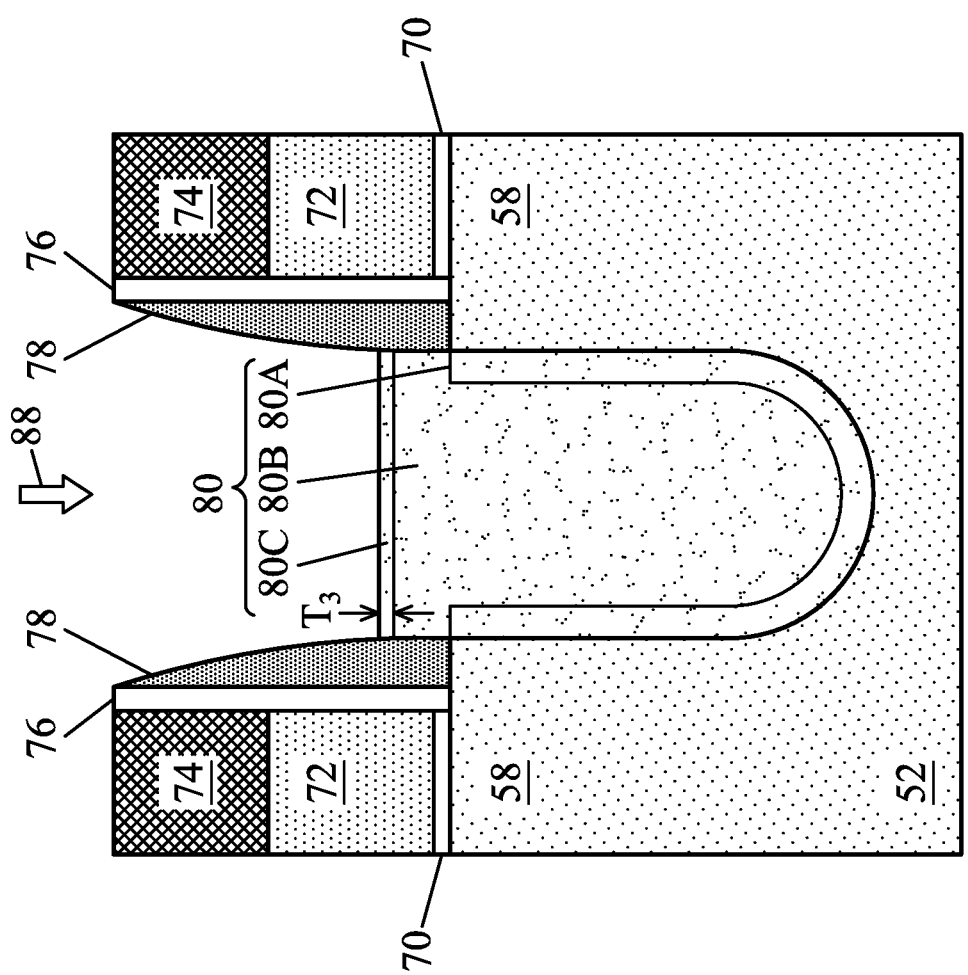

In FIG. 9, a third epitaxial growth process 88 may be performed to form third epitaxial layers 80C. The third epitaxial growth process 88 is optional, and may be omitted. The third epitaxial layers 80C are finishing layers, and may be removed or consumed during a subsequent silicidation process.

During the third epitaxial growth process 88, the epitaxial source/drain regions 80 are exposed to several precursors, including semiconductor material precursor(s), dopant precursor(s), and etching precursor(s). The recesses 82 may be simultaneously exposed to all of the precursors, or may be exposed to the precursors in repeating cycles. For example, the recesses 82 may be exposed to the semiconductor material precursor(s) and dopant precursor(s) in first portions of the cycles, and the etching precursor(s) in second portions of the cycles. The dopant concentration of the third epitaxial layers 80C is less than the dopant concentration of the first epitaxial layers 80A and the second epitaxial layers 80B, which may increase the growth selectivity of the third epitaxial layers 80C. The third epitaxial layers 80C are sacrificial layers that protect the second epitaxial layers 80B during subsequent processing, and are removed during the subsequent formation of source/drain contacts (discussed further below with respect to FIGS. 15A and 15B). In embodiments where the epitaxial source/drain regions 80 include silicon germanium, such as when p-type source/drain regions are formed, the third epitaxial layers 80C are formed with a low dopant (e.g., boron) concentration and a low germanium concentration. For example, the dopant (e.g., boron) concentration of the third epitaxial layers 80C may be in the range of about $9 \times 10^{19}$ cm$^{-3}$ to about $2 \times 10^{20}$ cm$^{-3}$, and the germanium concentration of the third epitaxial layers 80C may be in the range of about 20% to about 22%. Notably, the germanium concentration of the third epitaxial layers 80C is less than the germanium concentration of the first epitaxial layers 80A and the second epitaxial layers 80B.

The precursors for the third epitaxial growth process 88 may be the same as the precursors for the second epitaxial growth process 86, but may be flowed at different rates. For example, when the epitaxial source/drain regions 80 are SiCP, such as when n-type source/drain regions are formed, the dopant concentration of the third epitaxial layers 80C may be reduced by flowing less phosphine and less hydrocarbon during the third epitaxial growth process 88 than during the second epitaxial growth process 86. Likewise, when the epitaxial source/drain regions 80 are SiGeB, such as when p-type source/drain regions are formed, the dopant and germanium concentrations of the third epitaxial layers 80C may be reduced by flowing less germane and less diborane during the third epitaxial growth process 88 than during the second epitaxial growth process 86.

The third epitaxial growth process 88 also has a bottom-up growth profile, and is performed until the third epitaxial layers 80C are a desired thickness. For example, the third epitaxial layers 80C can have a thickness $T_3$ in the range of about 0.5 nm to about 10 nm. The growth profile of the third epitaxial growth process 88 may be determined by controlling the temperature and pressure during the third epitaxial growth process 88. In particular, the third epitaxial growth process 88 is performed with a high temperature and a low pressure. For example, the temperature of the third epitaxial growth process 88 can be greater than about 600° C., such as in the range of about 600° C. to about 620° C., and the pressure of the third epitaxial growth process 88 can be less than about 50 Torr, such as in the range of about 20 Torr to about 30 Torr. The temperature of the third epitaxial growth process 88 may be less than the temperature of the second epitaxial growth process 86 and may be greater than the temperature of the first epitaxial growth process 84. The pressure of the third epitaxial growth process 88 may be greater than the pressure of the second epitaxial growth process 86 and may be less than the pressure of the first epitaxial growth process 84.

Figure 10:
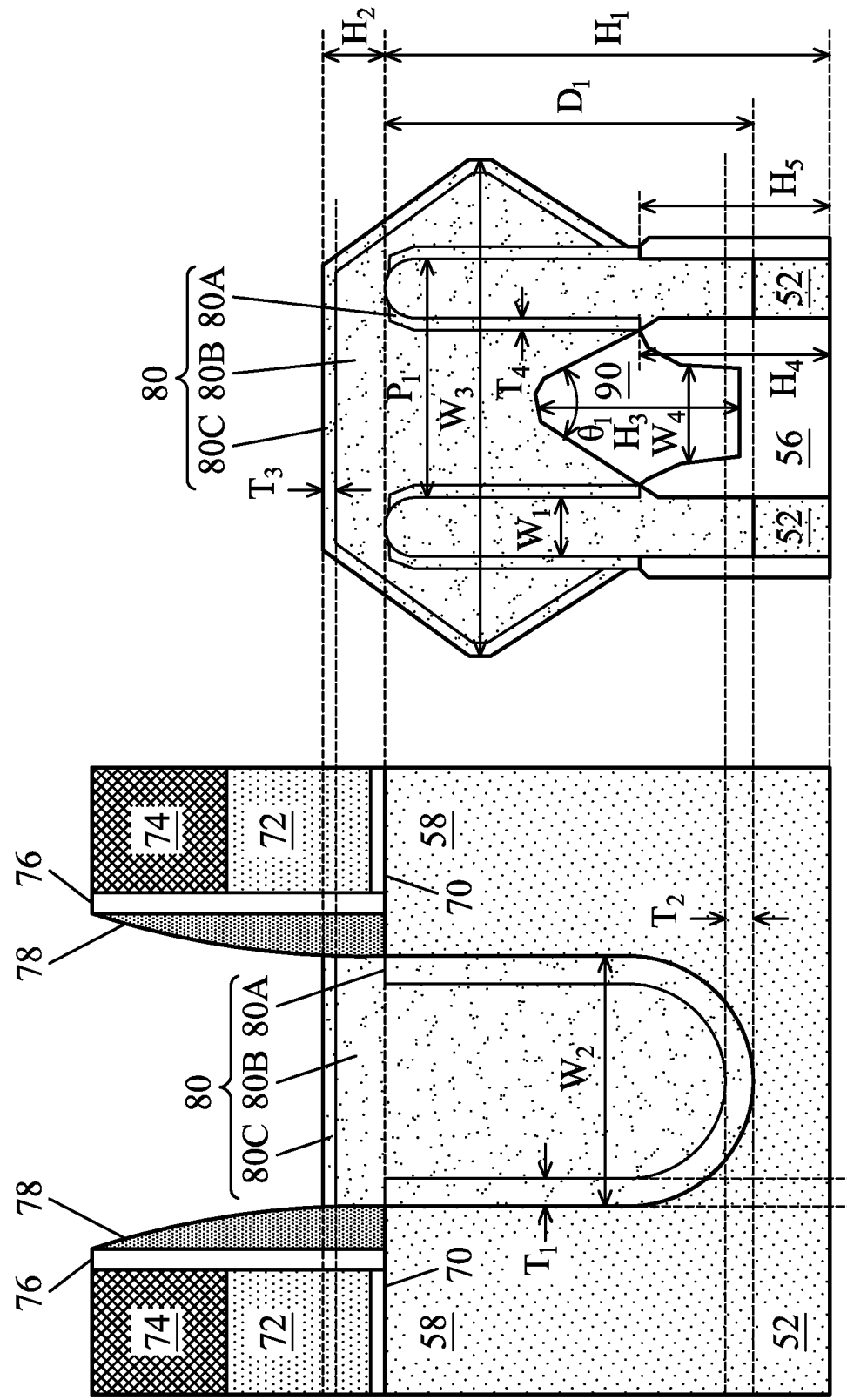

FIG. 10 illustrates one of the epitaxial source/drain regions 80 after formation. FIG. 10 illustrates the epitaxial source/drain region 80 along reference cross-sections B-B and C-C in FIG. 1, and shows both cross-sections together for ease of illustration. In this embodiment, the epitaxial source/drain regions 80 have flat upper surfaces, which are raised from respective surfaces of the fins 52. In some embodiments, the epitaxial source/drain regions 80 can have convex upper surfaces. The epitaxial source/drain regions 80 have an overall width $W_3$. The overall width $W_3$ can be in the range of about 40 nm to about 80 nm.

Adjacent epitaxial source/drain regions 80 may merge so that the resulting epitaxial source/drain regions 80 span multiple fins 52 (e.g., a pair of fins 52 in the example shown), which are part of a same FinFET. When adjacent epitaxial source/drain regions 80 merge, air gaps 90 are formed beneath the epitaxial source/drain regions 80, between neighboring pairs of the fins 52 for the FinFET. The air gaps 90 can have a height $H_3$ in the range of about 0 nm to about 50 nm. The air gaps 90 also have interior angles $\theta_1$ where the neighboring epitaxial source/drain regions 80 merge. The interior angles $\theta_1$ of the air gaps 90 can be in the range of about 10° to about 150°. The isolation regions 56 may have concave upper surfaces between neighboring pairs of the fins 52, increasing the volume of the air gaps 90. The air gaps 90 have a width $W_4$ between adjacent portions of the STI regions 56. The width $W_4$ can be in the range of about 0 nm to about 50 nm.

The process for etching the source/drain regions of the fins 52 may have some process variations. In particular, neighboring pairs of the fins 52 for a same FinFET may be closely grouped together such that the outer sidewalls of the fin 52 are etched at a greater rate than inner sidewalls of the fins 52. Portions of the STI regions 56 along the inner sidewalls of the fins 52 can have a height $H_4$ of greater than about 25 nm, such as a height $H_4$ in the range of about 30 nm to about 50 nm, and portions of the STI regions 56 along the outer sidewalls of the fins 52 can have a height $H_5$ of greater than about 20 nm, such as a height $H_5$ in the range of about 25 nm to about 45 nm.

FIG. 10 also illustrates further aspects of the first epitaxial layers 80A. In addition to having a thickness $T_1$ along sides of the recesses 82 and a thickness $T_2$ along bottoms of the recesses 82, the first epitaxial layers 80A also have a lateral thickness $T_4$ along sidewalls of the fins 52. The lateral thickness $T_4$ can be less than about 6 nm, such as in the range of about 2 nm to about 4 nm. The lateral thickness $T_4$ is smaller than the sidewall thickness $T_1$ and the bottom thickness $T_2$.

Figure 11B:
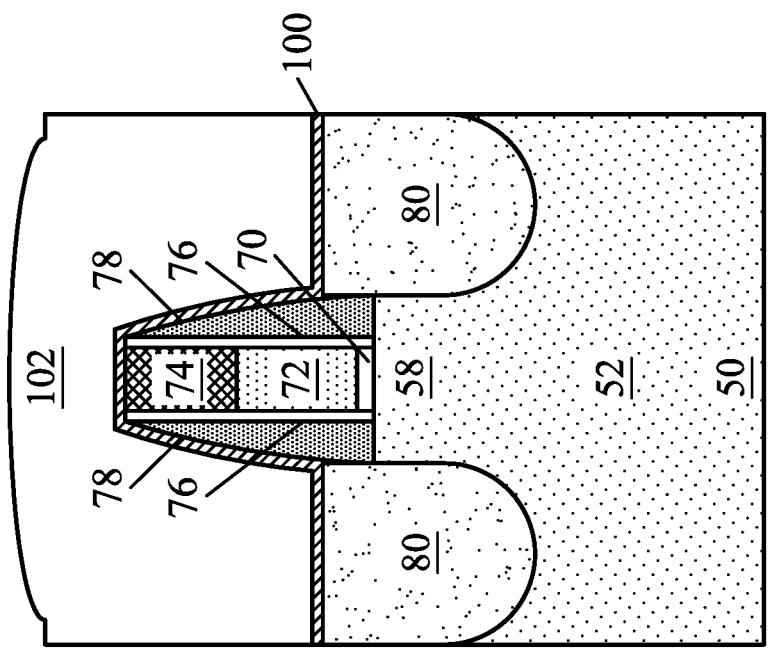
Figure 11A:
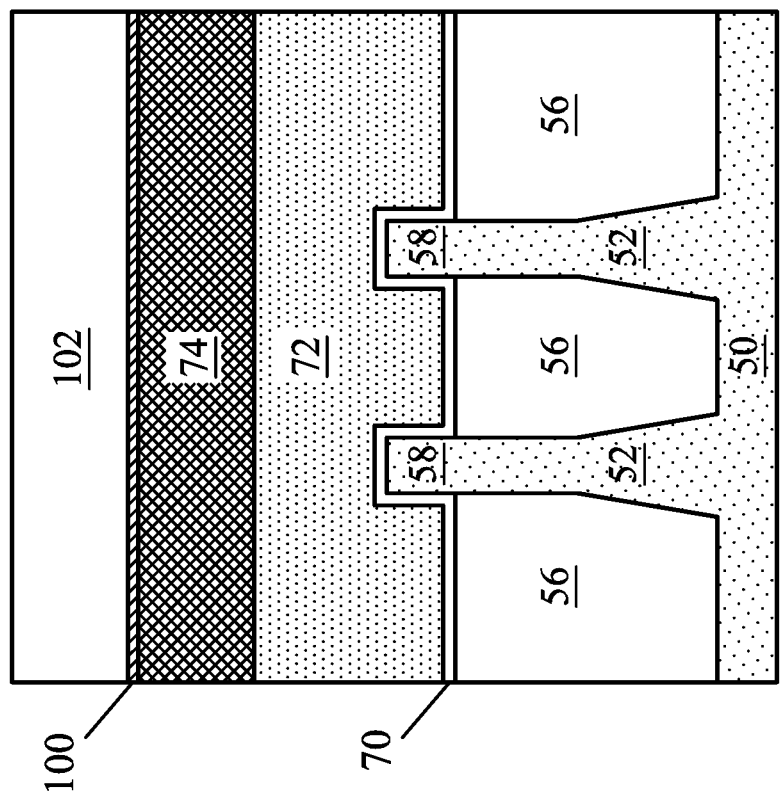

In FIGS. 11A and 11B, a first ILD 102 is deposited over the intermediate structure. The first ILD 102 may be formed of a dielectric material, and may be deposited by any suitable method, such as CVD, plasma-enhanced CVD (PECVD), or FCVD. Dielectric materials may include Phospho-Silicate Glass (PSG), Boro-Silicate Glass (BSG), Boron-Doped Phospho-Silicate Glass (BPSG), undoped Silicate Glass (USG), or the like. Other insulation materials formed by any acceptable process may be used. In some embodiments, a contact etch stop layer (CESL) 100 is disposed between the first ILD 102 and the epitaxial source/drain regions 80, the masks 74, and the gate spacers 78. The CESL 100 may comprise a dielectric material, such as, silicon nitride, silicon oxide, silicon oxynitride, or the like, having a different etch rate than the material of the overlying first ILD 102.

In FIGS. 12A and 12B, a planarization process, such as a CMP, may be performed to level the top surface of the first ILD 102 with the top surfaces of the dummy gates 72 or the masks 74. The planarization process may also remove the masks 74 on the dummy gates 72, and portions of the gate seal spacers 76 and the gate spacers 78 along sidewalls of the masks 74. After the planarization process, top surfaces of the dummy gates 72, the gate seal spacers 76, the gate spacers 78, and the first ILD 102 are level. Accordingly, the top surfaces of the dummy gates 72 are exposed through the first ILD 102. In some embodiments, the masks 74 may remain, in which case the planarization process levels the top surface of the first ILD 102 with the top surfaces of the top surface of the masks 74.

Figure 13B:
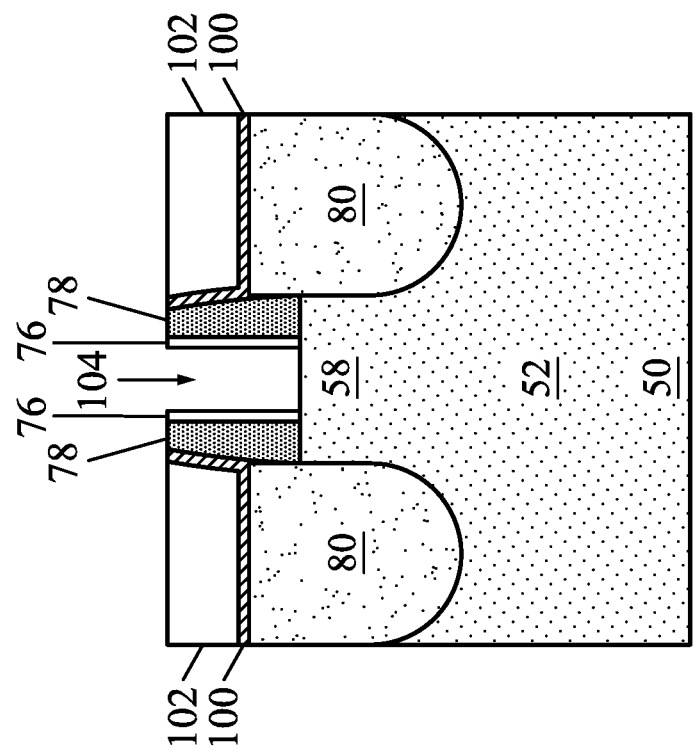
Figure 13A:
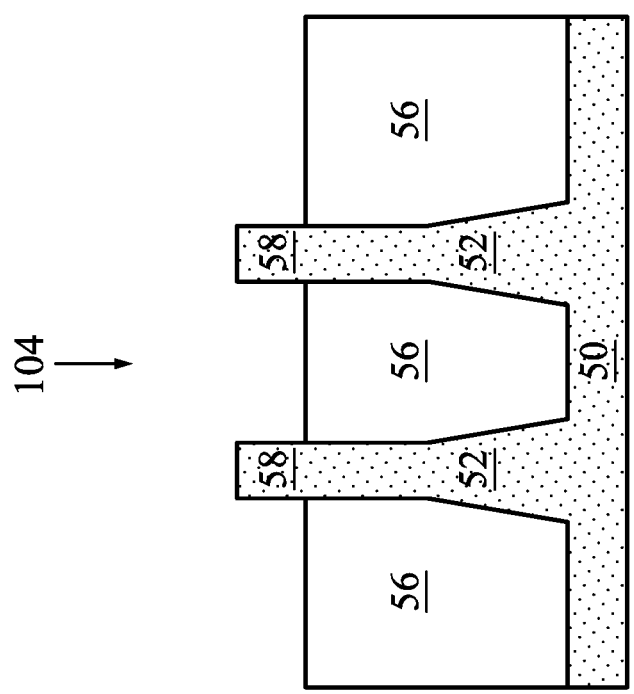

In FIGS. 13A and 13B, the dummy gates 72, and the masks 74 if present, are removed in an etching step(s), so that recesses 104 are formed. Portions of the dummy gate dielectrics 70 in the recesses 104 may also be removed. In some embodiments, only the dummy gates 72 are removed and the dummy gate dielectrics 70 remain and are exposed by the recesses 104. In some embodiments, the dummy gate dielectrics 70 are removed from recesses 104 in a first region of a die (e.g., a core logic region) and remain in recesses 104 in a second region of the die (e.g., an input/output region). In some embodiments, the dummy gates 72 are removed by an anisotropic dry etch process. For example, the etching process may include a dry etch process using reaction gas(es) that selectively etch the dummy gates 72 without etching the first ILD 102 or the gate spacers 78. Each recess 104 exposes a channel region 58 of a respective fin 52. Each channel region 58 is disposed between neighboring pairs of the epitaxial source/drain regions 80. During the removal, the dummy gate dielectrics 70 may be used as etch stop layers when the dummy gates 72 are etched. The dummy gate dielectrics 70 may then be optionally removed after the removal of the dummy gates 72.

Figure 14B:
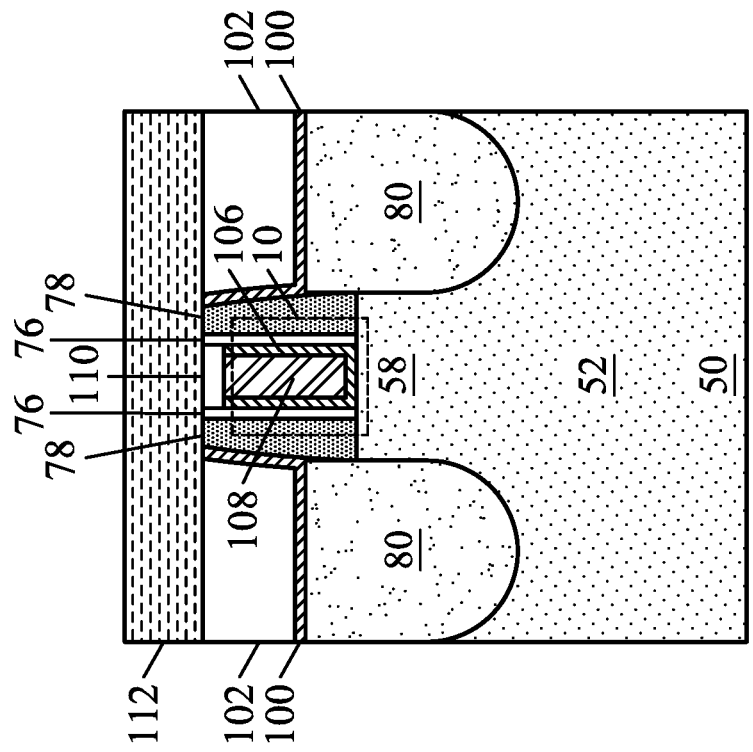
Figure 14A:
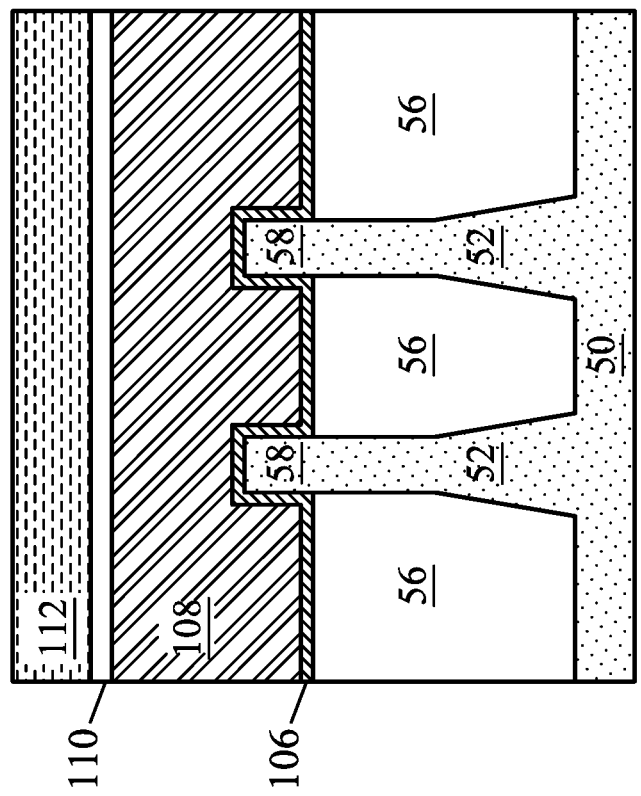
Figure 14C:
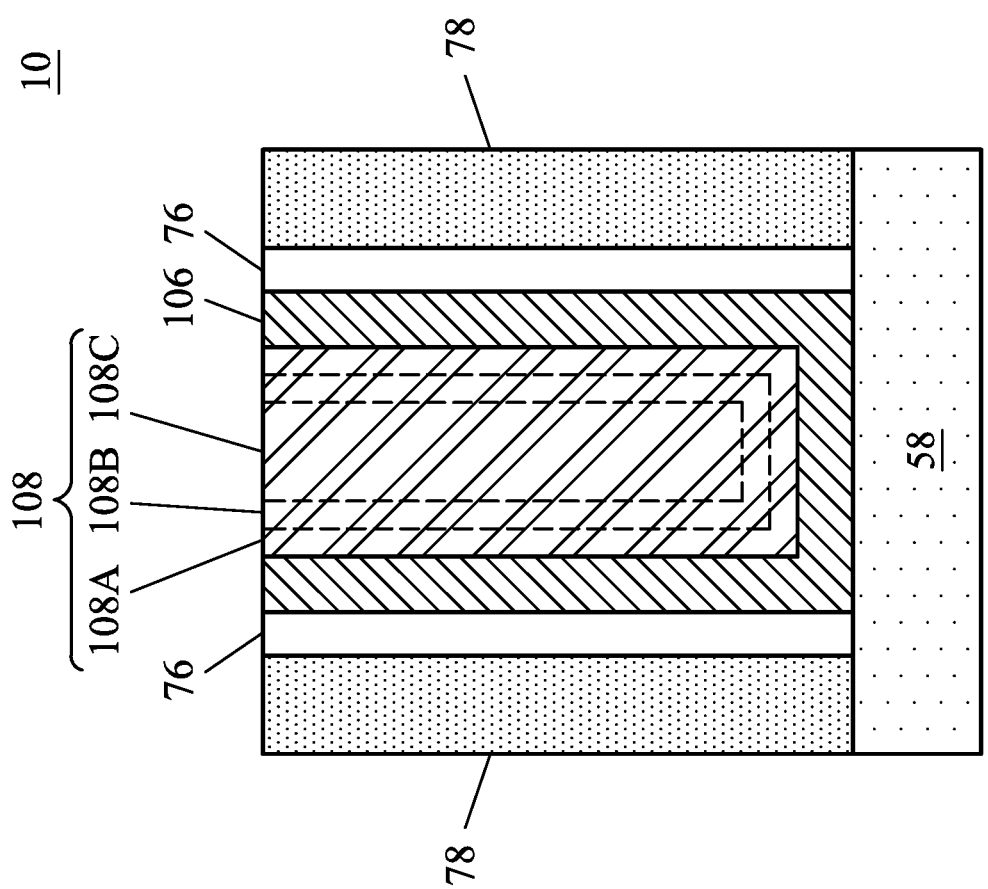

In FIGS. 14A and 14B, gate dielectrics 106 and gate electrodes 108 are formed for replacement gates. FIG. 14C illustrates a detailed view of region 10 of FIG. 14B. The gate dielectrics 106 are deposited conformally in the recesses 104, such as on the top surfaces and the sidewalls of the fins 52 and on sidewalls of the gate seal spacers 76/gate spacers 78. The gate dielectrics 106 may also be formed on top surface of the first ILD 102. In accordance with some embodiments, the gate dielectrics 106 comprise silicon oxide, silicon nitride, or multilayers thereof. In some embodiments, the gate dielectrics 106 include a high-k dielectric material, and in these embodiments, the gate dielectrics 106 may have a k value greater than about 7.0, and may include a metal oxide or a silicate of Hf, Al, Zr, La, Mg, Ba, Ti, Pb, and combinations thereof. The formation methods of the gate dielectrics 106 may include Molecular-Beam Deposition (MBD), ALD, PECVD, and the like. In embodiments where portions of the dummy gate dielectrics 70 remain in the recesses 104, the gate dielectrics 106 include a material of the dummy gate dielectrics 70 (e.g., $SiO_2$).

The gate electrodes 108 are deposited over the gate dielectrics 106, respectively, and fill the remaining portions of the recesses 104. The gate electrodes 108 may include a metal-containing material such as TiN, TiO, TaN, TaC, Co, Ru, Al, W, combinations thereof, or multi-layers thereof. For example, although a single-layered gate electrode 108 is illustrated in FIG. 14B, the gate electrode 108 may comprise any number of liner layers 108A, any number of work function tuning layers 108B, and a fill material 108C as illustrated by FIG. 14C. After the filling of the gate electrodes 108, a planarization process, such as a CMP, may be performed to remove the excess portions of the gate dielectrics 106 and the material of the gate electrodes 108, which excess portions are over the top surface of the first ILD 102. The remaining portions of material of the gate electrodes 108 and the gate dielectrics 106 thus form replacement gates of the resulting FinFETs. The gate electrodes 108 and the gate dielectrics 106 may be collectively referred to as "gate stacks" or "metal gate stacks," with each metal gate stack including a gate dielectric 106 and a gate electrode 108. The metal gate stacks may extend along sidewalls of a channel region 58 of the fins 52.

The formation of the gate dielectrics 106 in the region 50N and the region 50P may occur simultaneously such that the gate dielectrics 106 in each region are formed from the same materials, and the formation of the gate electrodes 108 may occur simultaneously such that the gate electrodes 108 in each region are formed from the same materials. In some embodiments, the gate dielectrics 106 in each region may be formed by distinct processes, such that the gate dielectrics 106 may be different materials, and/or the gate electrodes 108 in each region may be formed by distinct processes, such that the gate electrodes 108 may be different materials. Various masking steps may be used to mask and expose appropriate regions when using distinct processes.

A second ILD 112 is deposited over the first ILD 102. In some embodiment, the second ILD 112 is a flowable film formed by a flowable CVD method. In some embodiments, the second ILD 112 is formed of a dielectric material such as PSG, BSG, BPSG, USG, or the like, and may be deposited by any suitable method, such as CVD and PECVD. In accordance with some embodiments, before the formation of the second ILD 112, the metal gate stacks are recessed, so that recesses are directly over the metal gate stacks and between opposing portions of the gate spacers 78. A gate mask 110 comprising one or more layers of dielectric material, such as silicon nitride, silicon oxynitride, or the like, is filled in the recess, followed by a planarization process to remove excess portions of the dielectric material extending over the first ILD 102. Subsequently formed gate contacts will penetrate through the gate mask 110 to contact the top surface of the recessed gate electrode 108.

Figure 15A:
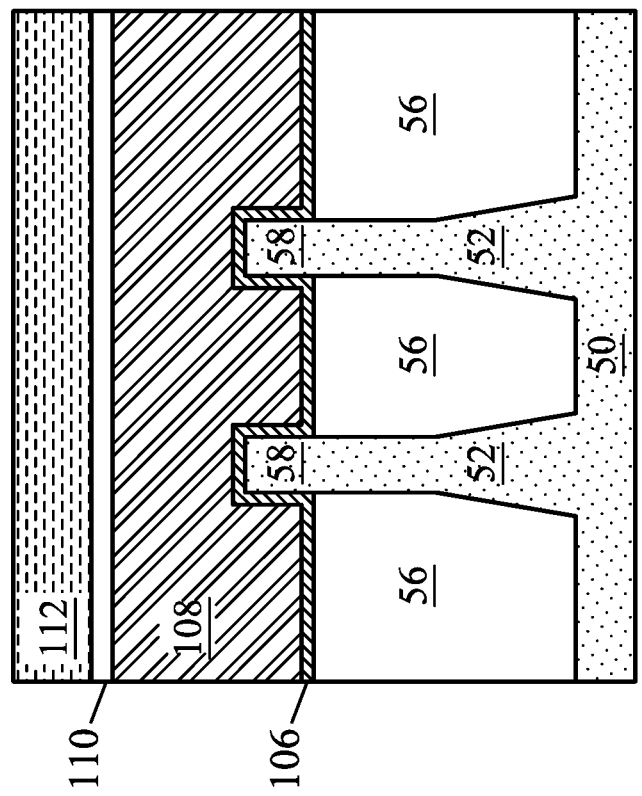
Figure 15B:
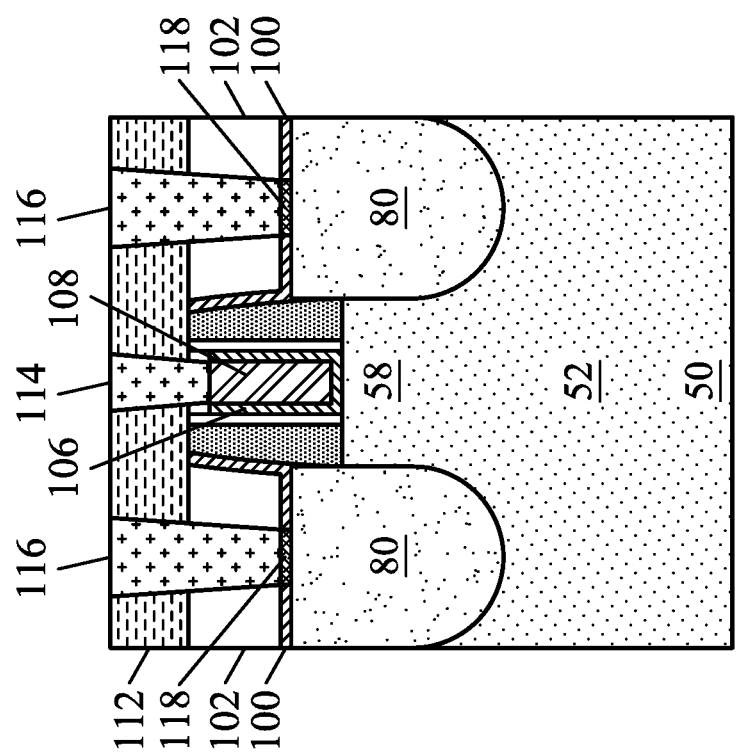

In FIGS. 15A and 15B, gate contacts 114 and source/drain contacts 116 are formed through the second ILD 112 and the first ILD 102 in accordance with some embodiments. Openings for the source/drain contacts 116 are formed through the first ILD 102 and the second ILD 112, and openings for the gate contact 114 are formed through the second ILD 112 and the gate mask 110. The openings may be formed using acceptable photolithography and etching techniques. The third epitaxial layers 80C (see FIG. 10) are removed during the formation of the openings, thereby exposing the second epitaxial layers 80B.

A silicide 118 may be formed on the epitaxial source/drain regions 80. In some embodiments, a conductive material is deposited on the epitaxial source/drain regions 80 (e.g., in the openings for the source/drain contacts 116) before the source/drain contacts 116 are formed. The conductive material may be titanium, cobalt, nickel, or the like, and may be a different conductive material than that of the source/drain contacts 116. The conductive material is annealed to form the silicide 118. The silicide 118 is physically and electrically coupled to the epitaxial source/drain regions 80.

A liner, such as a diffusion barrier layer, an adhesion layer, or the like, and a conductive material are then formed in the openings and on the silicide 118. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a surface of the second ILD 112. The remaining liner and conductive material form the source/drain contacts 116 and gate contacts 114 in the openings. The source/drain contacts 116 are physically and electrically coupled to the silicide 118, and the gate contacts 114 are physically and electrically coupled to the gate electrodes 108. The source/drain contacts 116 and gate contacts 114 may be formed in different processes, or may be formed in the same process. Although shown as being formed in the same cross-sections, it should be appreciated that each of the source/drain contacts 116 and gate contacts 114 may be formed in different cross-sections, which may avoid shorting of the contacts.

Embodiments may achieve advantages. Performing the first epitaxial growth process 84 at a low temperature and a high pressure allows the first epitaxial layers 80A to be formed with a more conformal growth profile. The first epitaxial layers 80A may thus be formed with a higher germanium concentration without risking defects in the epitaxial source/drain regions 80. Forming the first epitaxial layers 80A to a high germanium concentration increases the stress exerted on the channel regions 58, thereby increasing the mobility of carriers and reducing the resistance in the channel regions 58. A high germanium concentration in the first epitaxial layers 80A also decreases the resistance in the epitaxial source/drain regions 80. Reducing the resistance in the channel regions 58 and/or the epitaxial source/drain regions 80 may increase the performance of the resulting FinFETs. Finally, a high germanium concentration in the first epitaxial layers 80A also reduces dopant migration from the second epitaxial layers 80B to the channel regions 58, thus reducing DIBL, which may increase the performance of the resulting FinFETs.

In an embodiment, a device includes: a fin extending from a substrate; a gate stack over a channel region of the fin; and a source/drain region in the fin adjacent the channel region, the source/drain region including: a first epitaxial layer contacting sidewalls of the fin, the first epitaxial layer including silicon and germanium doped with a dopant, the first epitaxial layer having a first concentration of the dopant; and a second epitaxial layer on the first epitaxial layer, the second epitaxial layer including silicon and germanium doped with the dopant, the second epitaxial layer having a second concentration of the dopant, the second concentration being greater than the first concentration, the first epitaxial layer and the second epitaxial layer having a same germanium concentration.

In some embodiments of the device, the first epitaxial layer has a first portion extending along sidewalls of the second epitaxial layer, and a second portion extending along a bottom of the second epitaxial layer, the first portion having a first thickness, the second portion having a second thickness, a ratio of the first thickness to the second thickness being from 1 to 1.1. In some embodiments of the device, the germanium concentration is from 45 at. % to 55 at. %. In some embodiments of the device, the first concentration of the dopant is from $2\times10^{20}$ cm$^{-3}$ to $3\times10^{20}$ cm$^{-3}$. In some embodiments of the device, the second concentration of the dopant is from $7\times10^{20}$ cm$^{-3}$ to $1\times10^{21}$ cm$^{-3}$. In some embodiments of the device, the second concentration of the dopant decreases in a direction extending from a topmost surface of the second epitaxial layer to a bottommost surface of the second epitaxial layer.

In an embodiment, a method includes: forming a fin extending from a substrate; forming a gate stack over a channel region of the fin; forming a recess in the fin adjacent the channel region; growing a first epitaxial layer along sidewalls and a bottom of the recess with a first epitaxial growth process, the first epitaxial growth process having a first growth rate along the sidewalls of the recess and a second growth rate along the bottom of the recess, the second growth rate being greater than the first growth rate; and growing a second epitaxial layer on the first epitaxial layer in the recess with a second epitaxial growth process, the second epitaxial growth process having a third growth rate along the sidewalls of the recess and a fourth growth rate along the bottom of the recess, the third growth rate being less than the first growth rate, the fourth growth rate being greater than the second growth rate.

In some embodiments of the method, the first epitaxial growth process is performed at a first temperature and a first pressure, and the second epitaxial growth process is performed at a second temperature and a second pressure, the first temperature being less than the second temperature, the first pressure being greater than the second pressure. In some embodiments of the method, the first epitaxial growth process is performed with first semiconductor material precursors and a dopant precursor, and the second epitaxial growth process is performed with second semiconductor material precursors and the dopant precursor, at least a subset of the second semiconductor material precursors being different from the first semiconductor material precursors. In some embodiments of the method, the dopant precursor is diborane, the first semiconductor material precursors are silane and germane, and the second semiconductor material precursors are dichlorosilane and germane. In some embodiments of the method, the diborane is dispensed at a greater flow rate during the second epitaxial growth process than during the first epitaxial growth process, and the germane is dispensed at a greater flow rate during the second epitaxial growth process than during the first epitaxial growth process.

In an embodiment, a method includes: forming a fin extending from a substrate; forming a gate stack over a channel region of the fin; forming a recess in the fin adjacent the channel region; growing a first epitaxial layer along sidewalls and a bottom of the recess with a first epitaxial growth process, the first epitaxial growth process being performed at a first temperature and a first pressure; and growing a second epitaxial layer on the first epitaxial layer in the recess with a second epitaxial growth process, the second epitaxial growth process being performed at a second temperature and a second pressure, the first temperature being less than the second temperature, the first pressure being greater than the second pressure.

In some embodiments of the method, the first temperature is from 450° C. to 600° C. In some embodiments of the method, the second temperature is from 600° C. to 650° C. In some embodiments of the method, the first pressure is from 30 Torr to 100 Torr. In some embodiments of the method, the second pressure is from 10 Torr to 20 Torr. In some embodiments of the method, the first epitaxial layer is boron-doped silicon germanium having a first germanium concentration and a first boron concentration, and the second epitaxial layer is boron-doped silicon germanium having the first germanium concentration and a second boron concentration, the second boron concentration being greater than the first boron concentration. In some embodiments, the method further includes: growing a third epitaxial layer on the second epitaxial layer with a third epitaxial growth process, the third epitaxial growth process being performed at a third temperature and a third pressure, the first temperature being less than the third temperature, the first pressure being greater than the third pressure. In some embodiments of the method, the third epitaxial layer is boron-doped silicon germanium having a second germanium concentration and a third boron concentration, the third boron concentration being less than the first boron concentration and the second boron concentration, the second germanium concentration being less than the first germanium concentration. In some embodiments of the method, the first epitaxial growth process has a first growth rate along the sidewalls of the recess and a second growth rate along the bottom of the recess, the second growth rate being greater than the first growth rate, and where the second epitaxial growth process has a third growth rate along the sidewalls of the recess and a fourth growth rate along the bottom of the recess, the third growth rate being less than the first growth rate, the fourth growth rate being greater than the second growth rate.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a fin extending from a substrate;
forming a gate stack over a channel region of the fin;
forming a recess in the fin adjacent the channel region;
growing a first epitaxial layer along sidewalls and a bottom of the recess with a first epitaxial growth process, the first epitaxial growth process having a first growth rate along the sidewalls of the recess and a second growth rate along the bottom of the recess, the second growth rate being greater than the first growth rate; and
growing a second epitaxial layer on the first epitaxial layer in the recess with a second epitaxial growth process, the second epitaxial growth process having a third growth rate along the sidewalls of the recess and a fourth growth rate along the bottom of the recess, the third growth rate being less than the first growth rate, the fourth growth rate being greater than the second growth rate.

2. The method of claim 1, wherein the first epitaxial growth process is performed at a first temperature and a first pressure, and the second epitaxial growth process is performed at a second temperature and a second pressure, the first temperature being less than the second temperature, the first pressure being greater than the second pressure.

3. The method of claim 1, wherein the first epitaxial growth process is performed with first semiconductor material precursors and a dopant precursor, and the second epitaxial growth process is performed with second semiconductor material precursors and the dopant precursor, at least a subset of the second semiconductor material precursors being different from the first semiconductor material precursors.

4. The method of claim 3, wherein the dopant precursor is diborane, the first semiconductor material precursors are silane and germane, and the second semiconductor material precursors are dichlorosilane and germane.

5. The method of claim 4, wherein the diborane is dispensed at a greater flow rate during the second epitaxial growth process than during the first epitaxial growth process, and the germane is dispensed at a greater flow rate during the second epitaxial growth process than during the first epitaxial growth process.

6. A method comprising:
forming a fin extending from a substrate;
forming a gate stack over a channel region of the fin;
forming a recess in the fin adjacent the channel region;
growing a first epitaxial layer along sidewalls and a bottom of the recess with a first epitaxial growth process, the first epitaxial growth process being performed at a first temperature and a first pressure; and
growing a second epitaxial layer on the first epitaxial layer in the recess with a second epitaxial growth process, the second epitaxial growth process being performed at a second temperature and a second pressure, the first temperature being less than the second temperature, the first pressure being greater than the second pressure.

7. The method of claim 6, wherein the first temperature is from 450° C. to 600° C.

8. The method of claim 6, wherein the second temperature is from 600° C. to 650° C.

9. The method of claim 6, wherein the first pressure is from 30 Torr to 100 Torr.

10. The method of claim 6, wherein the second pressure is from 10 Torr to 20 Torr.

11. The method of claim 6, wherein the first epitaxial layer is boron-doped silicon germanium having a first germanium concentration and a first boron concentration, and the second epitaxial layer is boron-doped silicon germanium having the first germanium concentration and a second boron concentration, the second boron concentration being greater than the first boron concentration.

12. The method of claim 11 further comprising:
growing a third epitaxial layer on the second epitaxial layer with a third epitaxial growth process, the third epitaxial growth process being performed at a third temperature and a third pressure, the first temperature being less than the third temperature, the first pressure being greater than the third pressure.

13. The method of claim 12, wherein the third epitaxial layer is boron-doped silicon germanium having a second germanium concentration and a third boron concentration, the third boron concentration being less than the first boron concentration and the second boron concentration, the second germanium concentration being less than the first germanium concentration.

14. The method of claim 6, wherein the first epitaxial growth process has a first growth rate along the sidewalls of the recess and a second growth rate along the bottom of the recess, the second growth rate being greater than the first growth rate, and wherein the second epitaxial growth process has a third growth rate along the sidewalls of the recess and a fourth growth rate along the bottom of the recess, the third growth rate being less than the first growth rate.

15. A method comprising:
forming a gate stack over a channel region of a substrate; and
forming a source/drain region comprising:
etching a recess in the substrate adjacent the channel region;
growing a first epitaxial layer on sidewalls and a bottom surface of the recess, the first epitaxial layer comprising boron-doped silicon germanium having a first boron concentration and a first germanium concentration;
growing a second epitaxial layer on the first epitaxial layer, the second epitaxial layer comprising boron-doped silicon germanium having a second boron concentration and the first germanium concentration, the second boron concentration greater than the first boron concentration, a top surface of the second epitaxial layer raised above a top surface of the substrate; and
growing a third epitaxial layer on the second epitaxial layer, the third epitaxial layer comprising boron-doped silicon germanium having a third boron concentration and a second germanium concentration, the third boron concentration less than the second boron concentration and the first boron concentration, the second germanium concentration less than the first germanium concentration.

16. The method of claim 15, wherein the first germanium concentration is from 45 at. % to 55 at. %.

17. The method of claim 15, wherein after forming the source/drain region, the second boron concentration decreases in a direction extending from the top surface of the second epitaxial layer to a bottom surface of the second epitaxial layer.

18. The method of claim 15, wherein growing the first epitaxial layer comprises performing a first epitaxial growth process at a first temperature and a first pressure, and wherein growing the second epitaxial layer comprises performing a second epitaxial growth process at a second temperature and a second pressure, the first temperature being less than the second temperature, the first pressure being greater than the second pressure.

19. The method of claim 15, wherein growing the first epitaxial layer comprises performing a first epitaxial growth process, and wherein growing the second epitaxial layer comprises performing a second epitaxial growth process, the first epitaxial growth process having a first growth rate along the sidewalls of the recess and having a second growth rate along the bottom surface of the recess, the second growth rate being greater than the first growth rate, and the second epitaxial growth process having a third growth rate along the sidewalls of the recess and having a fourth growth rate along the bottom surface of the recess, the third growth rate being less than the first growth rate, the fourth growth rate being greater than the second growth rate.

20. The method of claim 18, wherein growing the third epitaxial layer comprises performing a third epitaxial growth process, the third epitaxial growth process being performed at a third temperature and a third pressure, the first temperature being less than the third temperature, the first pressure being greater than the third pressure.

* * * * *